(12) United States Patent
Suzuki et al.

(10) Patent No.: US 7,825,449 B2
(45) Date of Patent: Nov. 2, 2010

(54) SILICON CARBIDE SEMICONDUCTOR DEVICE AND RELATED MANUFACTURING METHOD

(75) Inventors: Naohiro Suzuki, Anjo (JP); Yuuichi Takeuchi, Oobu (JP); Takeshi Endo, Oobu (JP); Eiichi Okuno, Mizuho (JP); Toshimasa Yamamoto, Ichinomiya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/289,624

(22) Filed: Oct. 30, 2008

(65) Prior Publication Data

US 2009/0114969 A1 May 7, 2009

(30) Foreign Application Priority Data

Nov. 6, 2007 (JP) .................. 2007-288545

(51) Int. Cl.
*H01L 29/94* (2006.01)
*H01L 21/04* (2006.01)
*H01L 29/68* (2006.01)

(52) U.S. Cl. .............. 257/301; 257/77; 257/328; 257/E29.346; 257/E29.169; 257/E21.054; 438/270

(58) Field of Classification Search ........... 257/301, 257/328–332, 341–342, 77, 354, 339, E29.169, 257/E29.066, E29.04, E29.084, E29.104, 257/E29.128, E21.054; 438/270, 44, 40, 438/931, 552, 243, 212, 286, 268, 271, 335, 438/336, 589

See application file for complete search history.

(56) References Cited

U.S. PATENT DOCUMENTS

| 5,689,128 A | 11/1997 | Hshieh et al. |
| 5,744,826 A | 4/1998 | Takeuchi et al. |
| 6,057,558 A | 5/2000 | Yamamoto et al. |
| 6,133,587 A | 10/2000 | Takeuchi et al. |
| 2009/0146154 A1* | 6/2009 | Zhang et al. ............ 257/77 |

FOREIGN PATENT DOCUMENTS

| JP | A-H09-199724 | 7/1997 |
| JP | A-H10-308511 | 11/1998 |
| JP | A-H11-501459 | 2/1999 |
| JP | A-2001-267570 | 9/2001 |

OTHER PUBLICATIONS

English Translation of JP 2001-267570.*
Office Action mailed Feb. 16, 2010 from Japan Patent Office in corresponding JP Application No. 2007-288545 (and English translation).

* cited by examiner

*Primary Examiner*—Sue Purvis
*Assistant Examiner*—Whitney Moore
(74) *Attorney, Agent, or Firm*—Posz Law Group, PLC

(57) ABSTRACT

An SiC semiconductor device and a related manufacturing method are disclosed having a structure provided with a $p^+$-type deep layer formed in a depth equal to or greater than that of a trench to cause a depletion layer between at a PN junction between the $p^+$-type deep layer and an $n^-$-type drift layer to extend into the $n^-$-type drift layer in a remarkable length, making it difficult for a high voltage, resulting from an adverse affect arising from a drain voltage, to enter a gate oxide film. This results in a capability of minimizing an electric field concentration in the gate oxide film, i.e., an electric field concentration occurring at the gate oxide film at a bottom wall of the trench.

11 Claims, 11 Drawing Sheets

SILICON CARBIDE SEMICONDUCTOR DEVICE AND RELATED MANUFACTURING METHOD

CROSS REFERENCE TO RELATED APPLICATIONS

This application is related to Japanese Patent Application No. 2007-288545, filed on Nov. 6, 2007, the content of which are hereby incorporated by reference.

BACKGROUND OF THE INVENTION

1. Technical Field of the Invention

The present invention relates to silicon carbide semiconductor devices and, more particularly, to a silicon carbide semiconductor device (hereinafter referred to as "SiC") having a trench gate, and a related manufacturing method.

2. Description of the Related Art

In recent years, a SiC has been getting a lot of attention as raw material for power devices with increased electric-field breakdown strength. Due to the SiC semiconductor device formed with increased electric-field breakdown strength, the SiC semiconductor device is able to controllably switch a flow of large electric current. Therefore, the SiC semiconductor device has been expected to have applications to a control of a motor of a hybrid vehicle.

In order for the SiC semiconductor device to pass a further increased electric current, the SiC semiconductor device needs to have an increased channel density. To this end, a silicon transistor has been put into practical use upon adopting a MOSFET of a trench gate structure. It is natural for the trench gate structure to be applied to the SiC semiconductor device. However, applying such a trench gate structure to the SiC semiconductor device A has resulted in a serious issue. That is, the SiC semiconductor device has the increased electric-field breakdown strength ten times that of the silicon semiconductor device. Thus, the SiC semiconductor device has been used under a condition applied with a voltage approximately ten times greater than that applied to the silicon semiconductor device. Thus, a gate insulation film, formed in a trench so as to penetrate the SiC, is subjected to an electric field with an intensity ten times greater than that applied to the silicon semiconductor device, causing an issue to arise with a consequence of the gate insulation film being easily broken at corner areas of the trench. Upon making a calculation on such an electric field by simulation, it has been revealed that if a drain is applied with 1200V, then an electric field of 10 MV/cm is concentrated on the gate insulation film of the trench. Accordingly, in order to withstand such a high electric field concentration in actual use, the electric field concentration needs to be 5 MV/cm or less, i.e., one-half of the electric field concentration occurring on the gate insulation film.

Devices, which can address such an issue, include a SiC semiconductor device that is disclosed in Japanese Patent Application Publication 9-199724. With such a SiC semiconductor device, a trench gate has been designed to have sidewalls and a bottom wall whose thickness is made thicker than that of the sidewall with a view to minimizing the degree of electric field concentration at the bottom wall of the trench. More particularly, a trench gate structure on "a" (1120) plane has been prepared using a (000-1) c-plane substrate with 4H SiC. When using such a c-plane substrate to prepare a gate oxide film in the trench, having the trench sidewall placed on the "a" plane and the bottom wall placed on "c" plane, by thermal oxidation, the "c" plane has an oxidation rate five times greater than that of the "a" place. This enables the oxidizing film of the trench bottom wall to have a film thickness five times greater than that of the sidewall. This makes it possible to minimize the degree of electric field concentration at the bottom wall of the trench.

A simulation has been conducted on such a structure in which the SiC semiconductor device has an increased gate insulation film at the bottom wall of the trench with the trench sidewall having a film thickness of, for instance, 40 nm and the trench bottom wall having a film thickness of 200 nm. Upon making a calculation based on such a simulation, it has been confirmed that when the drain is applied with 1200V, the degree of electric field concentration on the gate insulation film of the trench is reduced to a level of 6.7 MV/cm. It has been found that such a reduction in electric field concentration remains inadequate and the electric field concentration needs to be further decreased.

SUMMARY OF THE INVENTION

The present invention has been completed with a view to addressing the above issues and has an object to provide a SiC semiconductor device operative to achieve a further reduction in an electric field concentration at a gate oxide film formed in a trench and a related manufacturing method.

To achieve the above object, one aspect of the present invention provides a SiC semiconductor device composed of an inversion-type trench gate structure MOSFET. The MOSFET includes a trench formed with a gate oxide film. The gate oxide film has a bottom wall and a sidewall with the bottom wall having a greater thickness than that of the sidewall. Controlling a voltage applied to a gate electrode allows a channel region to be formed on a surface area of a base region located at the sidewall of the trench. This allows an electric current to flow between first and second electrodes via a source region and a drift layer. With such a semiconductor device, a second electrically conductive type deep layer is located in an area spaced from the trench with the base region being intervened. The deep layer is formed to have a depth approximately equal to or greater than that of the trench and has a concentration approximately equal to or greater than that of the base region.

Thus, the SiC semiconductor device of the present embodiment takes the form of a structure provided with the deep layer having the depth approximately equal to or greater than that of the trench. This allows a depletion layer, present in a PN junction between the deep layer and the drift layer, to remarkably extend to the drift layer, making it difficult for a high voltage, resulting from an affect caused by a drain voltage, to be applied to the gate oxide film. This enables an electric field concentration in the gate oxide film, i.e., an electric field concentration in the gate oxide film especially at the bottom wall of the trench to be alleviated.

Although the present invention has been described above with reference to the SiC semiconductor device of the inversion-type trench gate structure, the present invention may be implemented in a modified structure. That is, a SiC semiconductor device composed of an accumulation-type trench gate structure MOSFET can adopt the same structure as that mentioned above with the resultant same advantageous effects as those mentioned above. With such an accumulation-type trench gate structure MOSFET, controlling a voltage applied to the gate electrode results in a control of a channel formed in a first electrically conductive type channel layer between the sidewall of the trench and the base region. This allows an electric current to flow between the first and second electrodes via the source region and the drift layer.

The SiC semiconductor device may preferably further include, for instance, second electrically conductive type contact regions, spaced in placement from the trench so as to sandwich the source region to allow the base regions to be electrically connected to the first electrode, each of which has a higher concentration than that of the base region. In this case, the deep layer is placed beneath the contact region to be unitarily formed with the contact region. The deep layer has a second electrically conductive type impurity concentration ranging from, for instance, $1.0 \times 10^{17}/cm^3$ to $1.0 \times 10^{20}/cm^3$. Further, the deep layer may be preferably arranged to have a depth of, for instance, 1.5 to 3.5 μm from a surface of the base region.

The SiC semiconductor device may preferably further comprise a second electrically conductive type reserve layer, formed on the drift layer in an area below the trench and the deep layer, which has a lower concentration than that of the deep layer.

With such a reserve layer being provided, an electric field of an area beneath the trench can be further reduced, enabling further improved effects to be obtained.

The SiC semiconductor device may preferably further comprise a first electrically conductive type low resistance region, formed in an area between the sidewall of the trench and the deep layer, which has a higher concentration than that of the drift layer.

With such a low resistance region being provided, the drift layer can have further lowered resistance, enabling a reduction on resistance. Such a low resistance region may be provided not only in the area between the sidewall of the trench and the deep layer but also in an area between the sidewall of the trench and the reserve layer.

Although the above description has been directed to the case in which the deep layer is provided, further, the deep layer may be replaced by a metallic layer that cooperates with the drift layer to provide a structure acting as a Schockley diode. With such a Schockley diode having a fast reacting speed being provided, the SiC semiconductor device can be formed in a structure with an increased withstand surge voltage.

The SiC semiconductor device can be manufactured in a method as described below.

For instance, the method of manufacturing the SiC semiconductor device comprises the steps of: preparing a first or second electrically conductive type substrate made of 4H SiC and having a surface on a (000-1) c-plane or a (0001) Si-plane; forming a drift layer on the substrate with the first electrically conductive type SiC with a lower impurity concentration that that of the substrate; forming a base region on the drift layer by ion-implanting a second electrically conductive type impurity in a given position spaced from a surface of the drift layer; forming a source region with the first electrically conductive type SiC with a higher concentration than that of the drift layer by ion-implanting a first electrically conductive type impurity on a surface layer portion of the base region in an area within the base region; forming a trench-gate forming trench in an area penetrating a surface of the drift layer to pass through the source region and the base region to reach the drift layer and including a sidewall having a surface extending in a [11-20] direction or a [1-100] direction; forming a deep-layer forming trench in an area spaced from the trench-gate forming trench by a given distance and having a depth equal to or greater than that of the trench-gate forming trench; infilling the deep-layer forming trench with a second electrically conductive type deep layer with a higher concentration than that of the base region; forming a gate oxide film over a surface of the trench-gate forming trench by thermal oxidation; forming a gate electrode on the gate oxide film in the trench-gate forming trench; forming a first electrode electrically in electrical connection to the source region; and forming a second electrode on the substrate at a rear surface thereof. Such a method enables the SiC semiconductor device of the inversion-type trench gate structure to be manufactured.

During the step of forming the base region, further, a plurality of base regions are formed at positions each spaced from the sidewall of the trench by a given distance. In addition, during the step of forming the trench-gate forming trench, the trench-gate forming trench is formed in an area between the plural base regions. The trench-gate forming trench is formed so as to extend from a surface of the drift layer to an area deeper than the source region and the base region and spaced from the base regions by a given distance with the sidewall laying on a surface extending in the [11-20] direction or the [1-100] direction.

In these cases, the step of forming a trench-gate forming trench and the step of forming a deep-layer forming trench may preferably allow the trench-gate forming trench and the deep-layer forming trench to be simultaneously formed. With such steps being carried out, the trench forming steps can be simplified.

With the method of manufacturing the SiC semiconductor device, before infilling the deep layer after forming the trench-gate forming trench and the deep-layer forming trench, a second electrically conductive impurity may be preferably ion implanted onto bottom walls of the trench-gate forming trench and the deep-layer forming trench. This allows a reserve layer to be formed with a lower concentration than that of the deep layer.

Further, during the step of forming the drift layer, a step may be preferably carried out for forming a first electrically conductive type low resistance region in an area deeper than the base region with the drift layer having a high concentration. During the step of forming the low resistance region, the low resistance region may be preferably formed in a position between the trench-gate forming trench and the deep layer. This allows the drift layer to have lowered resistance, thereby enabling a reduction in on resistance.

DETAILED DESCRIPTION OF PREFERRED EMBODIMENTS

Now, silicon carbide semiconductor devices and methods of manufacturing silicon carbide semiconductor device of various embodiments according to the present invention will be described below in detail with reference to the accompanying drawings. However, the present invention is construed not to be limited to such embodiments described below and technical concepts of the present invention may be implemented in combination with other known technologies or technology having functions equivalent to such known technologies.

In the following description, like references characters designate like or corresponding component parts throughout the several views.

First Embodiment

A silicon carbide (SiC) semiconductor device of a first embodiment according to the present invention will be described below in detail with reference to FIGS. 1 to 3. Here, a MOSFET of an inversion-type trench gate structure will be described as an element incorporated in the SiC semiconductor device.

Figure 1:
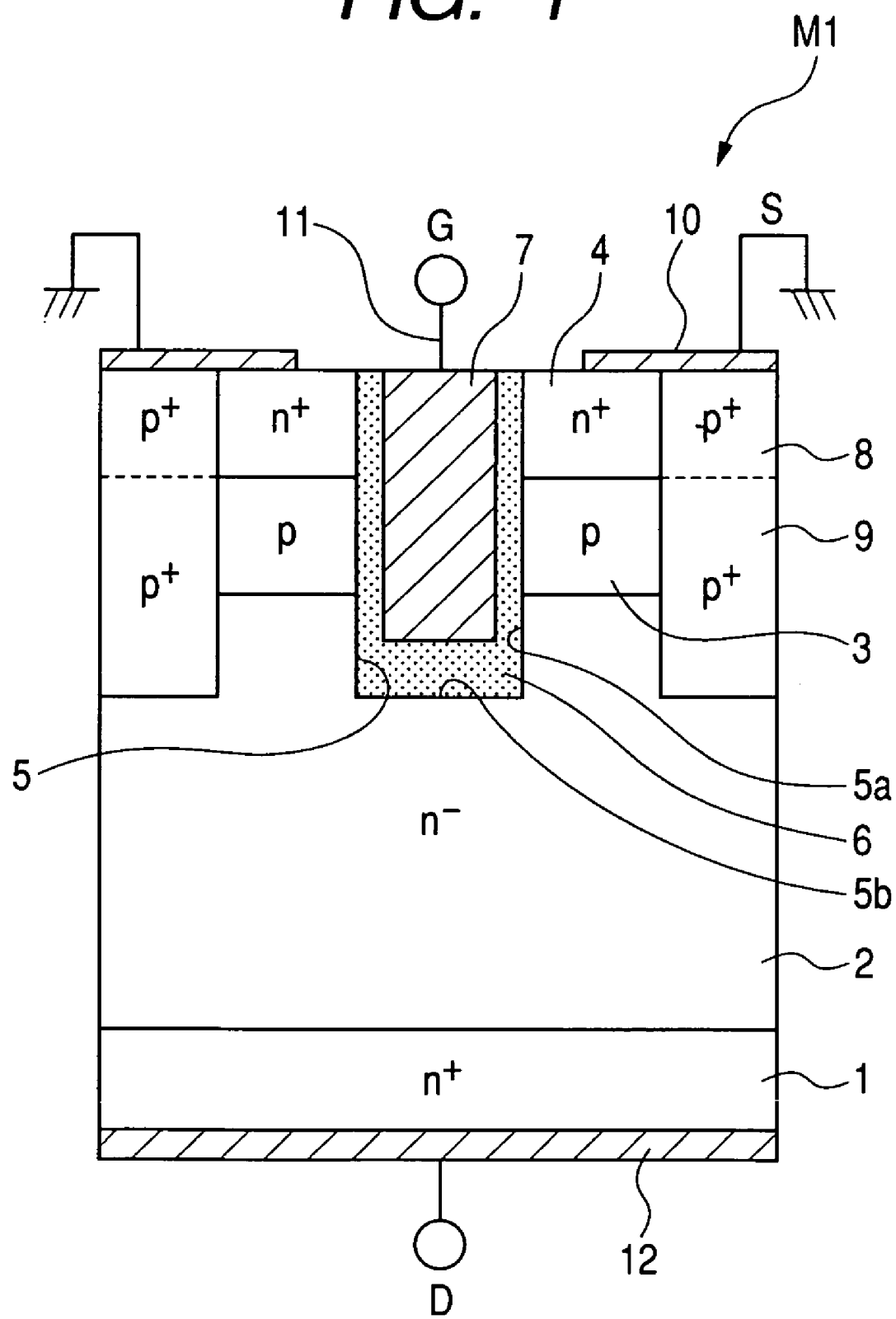
FIG. 1 is a cross-sectional view of a MOSFET of an inversion-type trench gate structure of a first embodiment according to the present invention.

FIG. 1 is a cross-sectional view of the MOSFET of such a trench gate structure of the present embodiment. Although FIG. 1 shows the MOSFET in terms of only one cell, it will be appreciated that the semiconductor device takes the form of a structure including a plurality of MOSFETs juxtaposed to each other with the same structures as that of the MOSFET shown in FIG. 1.

As shown in FIG. 1, the MOSFET M1 employs an $n^+$-type substrate 1 as a semiconductor substrate, which has a surface laying on a (000-1) c-plane with a thickness of about 300 μm while containing a nitrogen (an n-type impurity) concentration of approximately $1.0\times10^{19}/cm^3$. The $n^+$-type substrate 1 has one surface on which an $n^-$-type drift layer 2 is formed with a nitrogen concentration of approximately, for instance, $8.0\times10^{15}/cm^3$ and a thickness of approximately 15 μm. The $n^-$-type drift layer 2 has a surface part on which p-type base regions 3 are formed having upper layer portions formed with $n^+$-type source regions 4.

The p-type base regions 3 have a boron or aluminum (a p-type impurity) concentration of approximately, for instance, $1.0\times10^{17}/cm^3$ with a thickness of approximately 0.7 μm. The $n^+$-type source regions 4 have surface parts having a nitrogen concentration (surface concentration) of approximately, for instance, $1.0\times10^{21}/cm^3$ with a thickness of approximately 0.3 μm.

Further, a trench 5 is formed in a depth extending through the $n^+$-type source regions 4 and the p-type base regions 3 to reach the $n^-$-type drift layer 2 and has a width of approximately 2.0 μm with a depth of approximately 2.0 μm. The trench 5 has sidewalls 5a placed in contact with the p-type base regions 3 and the $n^+$-type source regions 4. The trench 5 has an inner wall surface covered with a gate oxide film 6 having a surface formed with a gate electrode 7 made of doped Poly-Si, with which the trench 5 is infilled.

The trench 5 has a bottom wall 5b laying on the same (000-1) c-plane as that of the $n^+$-type substrate 1 and sidewalls 5a each having, for instance, "a"-(11-20) plane, i.e., a plane extending in a [11-20] direction. The gate oxide film 6 is formed by thermally oxidizing the surface of the trench 5. This allows the bottom wall of the trench 5 to have an oxidizing rate about five times faster than that of the sidewall of the trench 5. Therefore, the gate oxide film 6 has a thickness of approximately 40 nm at the sidewall of the trench 5 and a thickness of approximately 200 nm on the bottom wall of the trench 5.

Further, the MOSFET M1 includes $p^+$-type contact regions 8 formed in areas opposite to a central area between the p-type base regions 3, between which the trench 5 is located, i.e., the trench 5 with the $n^+$-type source regions 4 being intervened. In addition, $p^+$-type deep layers 9 are formed in areas beneath the $p^+$-type contact regions 8, respectively, so as to have a depth greater than those of the p-type base regions 3. With the present embodiment, the $p^+$-type contact regions 8 and the $p^+$-type deep layers 9 are formed in unitary structures and made of boron or aluminum with a concentration ranging from $1.0\times10^{17}/cm^3$ to $1.0\times10^{20}/cm^3$. The $p^+$-type deep layers 9 have a depth equal to or greater than that of the trench 5. In addition, the $p^+$-type deep layers 9 are spaced from the sidewalls of the trench 5, respectively, by a given distance available to be suitably adjusted within a range of approximately, for instance, 2 to 5 μm.

Further, although the $p^+$-type deep layers 9 can be formed to be deeper than the trench 5 by a depth of 2.0 μm or more, the $p^+$-type deep layers 9 may have the same depth as that of the trench 5 with a structure shown in FIG. 1 when simultaneously forming the $p^+$-type deep layers 9 with the trench in a manner described below.

Furthermore, a source electrode 10 is formed on surfaces of the $n^+$-type source region 4 and the $p^+$-type contact region 8 and a gate lead wire 11 is connected to a surface of the gate electrode 7. The source electrode 10 and the gate lead wire 11 are made of a plurality of metals (such as, for instance, Ni/Al or the like), respectively. In this case, an area held in contact with at least n-type SiC (i.e., particularly the gate electrode 7 with the $n^+$-type source region 4 and the gate electrode 7 being n-doped in structure) is made of metal that can be kept in an ohmic contact with the n-type SiC. Another area held in contact with at least a p-type SiC (i.e., particularly the gate electrode 7 with the $p^+$-type contact regions 8 and the gate electrode 7 being n-doped in structure) is made of metal that can be kept in an ohmic contact with the p-type SiC. Also, the source electrode 10 and the gate lead wire 11 may be formed on an interlayer dielectric film (not shown) to be electrically insulated from each other and the source electrode 10 is electrically connected to the $n^+$-type source region 4 and the $p^+$-type contact region 8 via a contact hole formed in the interlayer dielectric film. In addition, the gate lead wire 11 is electrically connected to the gate electrode 7.

A drain electrode 12 is electrically connected to the $n^+$-type substrate 1 at a rear surface thereof. With such a structure, the MOSFET is formed in the inversion-type trench gate structure with an n-channel type.

With the MOSFET formed in such a structure, applying a gate voltage to the gate electrode 7 allows the p-type base regions 3 to have areas, placed in contact with the gate oxide film 6 located on the sidewalls of the trench 5, which provide inversion-type channels to allow an electric current to flow between the source electrode 10 and the drain electrode 12.

When this takes place, a high voltage (of, for instance, 1200V) of a value about ten times that of a voltage applied to a silicon device is used as the drain voltage. Therefore, due to an affect arising from such a high voltage, the gate oxide film 6 is applied with an electric field of a value about ten times that applied to the silicon device, causing the electric field to concentrate on the gate oxide film 6 (especially in an area of the gate oxide film 6 at the bottom wall of the trench 5). However, with the MOSFET M1 of the present embodiment, the $p^+$-type deep layers 9 are formed with a depth equal to or greater than that of the trench 5. This allows PN junctions each between the $p^+$-type deep layer 9 and the $n^-$-type drift layer 2 to have a depletion layer extending toward the $n^-$-type drift layer 2 in an increased depth, making it difficult for the high voltage to act on the gate oxide film 6 due to the affect of the drain voltage.

This makes it possible to alleviate the electric field concentration in the gate oxide film 6, i.e., the electric field concentration of the gate oxide film 6 in an area at the bottom wall of the trench 5. This results in a capability of preventing the gate oxide film 6 from being damaged.

Next, a method of manufacturing the trench gate type MOSFET, shown in FIG. 1, will be described below. FIGS. 2A to 2C and FIGS. 3A to 3C are cross-sectional views illustrating a process of manufacturing the trench gate type MOSFET shown in FIG. 1. The method of manufacturing the trench gate type MOSFET will now be described below in detail with reference to FIGS. 2A to 2C and FIGS. 3A to 3C.

Figure 2A:
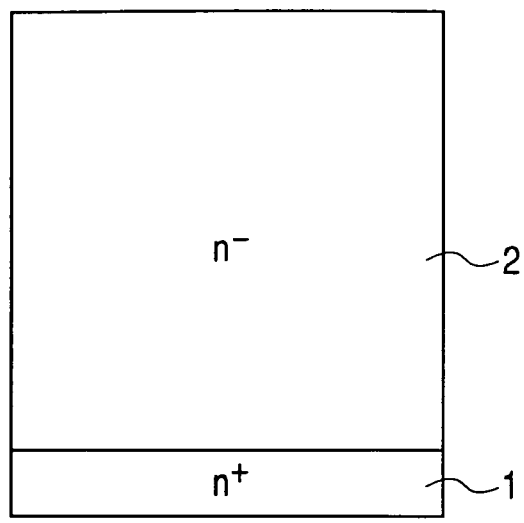
FIGS. 2A to 2C are cross-sectional views showing how the trench gate type MOSFET, shown in FIG. 1, is manufactured.

[Step Shown in FIG. 2A]

First, the $n^+$-type substrate 1 is prepared having a surface formed with a (000-1) c-plane and having a nitrogen concentration of, for instance, $1.0 \times 10^{19}/cm^3$ with a thickness of about 300 μm. Then, the $n^-$-type drift layer 2 is formed on the $n^+$-type substrate 1 by epitaxial growth so as to have a nitrogen concentration of, for instance, $8.0 \times 10^{15}/cm^3$ and a thickness of about 15 μm.

Figure 2B:
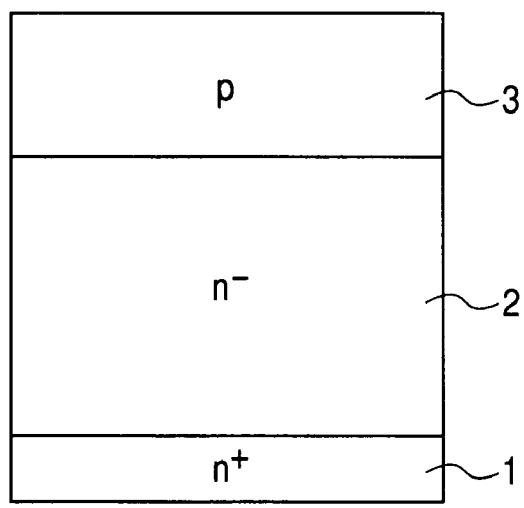

[Step Shown in FIG. 2B]

A low temperature oxide (LTO) mask is formed on a surface of the $n^-$-type drift layer 2 and then subjected to a photolithographic step. This allows the mask to be opened in a forming scheduled region for the p-type base region 3. Thereafter, a p-type impurity (such as, for instance, boron and aluminum) is ion implanted over the mask with the activation being initiated. This allows the p-type base region 3 to be formed with a boron or aluminum concentration of, for instance, $1.0 \times 10^{17}/cm^3$ with a thickness of about 0.7 μm. Subsequently, the mask is removed.

Figure 2C:
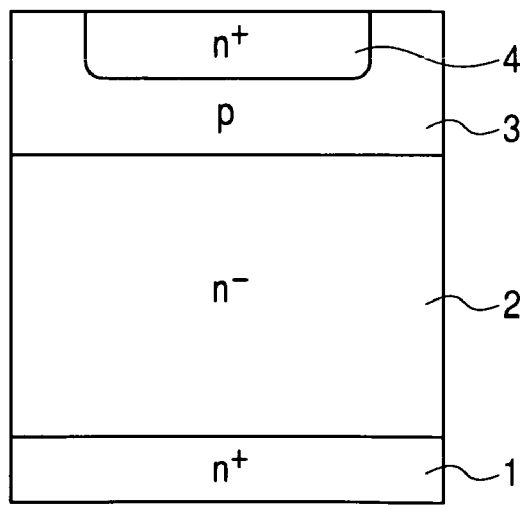

[Step Shown in FIG. 2C]

Mask layers, each made of, for instance, LTO or the like, are formed on the $n^-$-type drift layer 2 and the p-type base region 3 and subjected to a photolithographic step. This allows the masks to be opened in a forming scheduled region for the $n^+$-type source region 4. Thereafter, an n-type impurity (such as, for instance, nitrogen) is ion implanted. Subsequently, activating implanted ions allows the $n^+$-type source region 4 to be formed with a surface layer portion having, for instance, a nitrogen concentration of $1.0 \times 10^{21}/cm^3$ and a thickness of about 0.3 μm. Thereafter, the masks are removed.

Figure 3A:
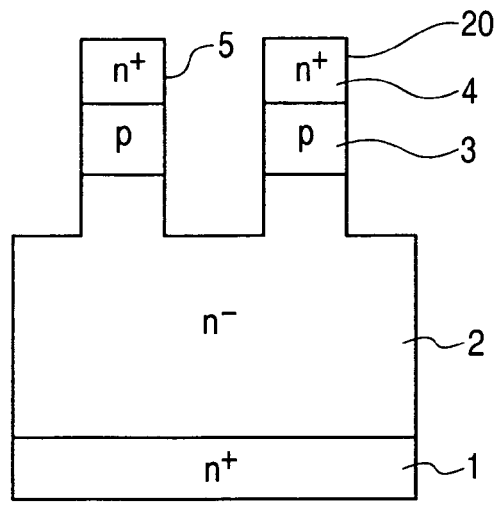
FIGS. 3A to 3C are cross-sectional views showing other steps, subsequent to the steps shown in FIGS. 2A to 2C, for manufacturing the trench gate type MOSFET shown in FIG. 1.

[Step Shown in FIG. 3A]

Etching masks (not shown) are formed on the $n^-$-type drift layer 2, the p-type base region 3 and the $n^+$-type source region 4, respectively, after which the etching masks are opened in a forming scheduled region for the trench 5, forming scheduled regions for the $p^+$-type contact region 8 and forming scheduled regions for the $p^+$-type deep layer 9. Thereafter, an anisotropic etching is conducted using the etching masks, after which an isotropic etching step or a sacrificed oxidizing step is carried out depending on needs. This allows the trench 5 to be formed while concurrently forming the trenches (deep-layer forming trenches) 20 in the forming scheduled regions for the $p^+$-type contact regions 8 and the forming scheduled regions for the $p^+$-type deep layers 9. This enables the trench forming steps to be simplified. Thereafter, the etching masks are removed.

Figure 3B:
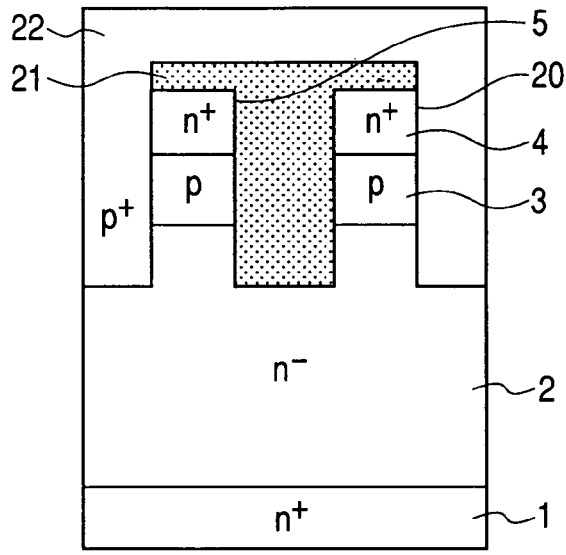

[Step Shown in FIG. 3B]

A mask 21, made of, for instance, LTO or the like, is formed over all surfaces of the trench 5, the trenches 20 and the $n^-$-type drift layer 2, after which of the mask 21, masked portions formed in the trenches 20 are removed. Then, a $p^+$-type layer 22 is formed by epitaxial growth with boron or aluminum being doped on front surfaces. This allows the trench layer 20, from which the mask 21 is removed, to be infilled with the $p^+$-type layer 22. Thereafter, Chemical Mechanical Polish (CMP) grinding is conducted to cause surfaces of the n-type drift layer 2, the p-type base regions 3 and the $n^+$-type source regions 4 to be exposed, upon which the mask 21 is removed from the inside of the trench 5. Thus, the $p^+$-type layer 22 is left in the trenches 20, thereby forming the $p^+$-type contact regions 8 and the $p^+$-type deep layers 9 in unitary structures.

Figure 3C:
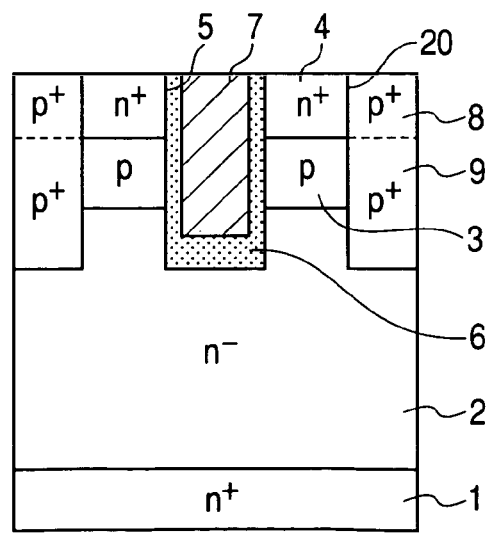

[Step Shown in FIG. 3C]

A gate oxide film forming step is conducted, thereby forming the gate oxide film 6. More particularly, the gate oxide film 6 is formed by gate oxidizing (thermal oxidizing) with a pyrogenic method using wet atmosphere. With such gate oxidizing, the bottom wall of the trench 5 has the same (000-1) c-plane as that of the $n^+$-type substrate 1, and the sidewall extending in the [11-20] direction, i.e., for instance, on a (1120) plane. This allows the bottom wall of the trench 5 to have an increasing oxidizing rate about five times greater than that of the trench 5 at the sidewall thereof. Therefore, the gate oxide film 6 has a thickness of about 40 nm on the sidewall of the trench 5 and a thickness of about 200 nm on the bottom wall of the trench 5. The gate oxide film 6 is formed by thermally oxidizing the surface of the trench 5.

Consecutively, a polysilicon layer, obtained by doping an n-type impurity, is formed on the surface of the gate oxide film 6 in a film with a thickness of about 440 nm at a temperature of, for instance, 600° C. Subsequently, patterning is conducted for the polysilicon layer and the gate oxide film 6 using a resist formed by photolithography etching. This allows the gate oxide film 6 and the gate electrode 7 to be left in the trench 5.

Subsequent steps are carried out in a manner similar to those of the related art and, hence, are not shown in the drawings. After forming an interlayer insulation film (not shown), the interlayer insulation film is subjected to patterning to form a contact hole connected to the $n^+$-type source region 4 and the $p^+$-type contact region 8, while forming another contact hole on another cross-sectional surface in connection to the gate electrode 7. In succeeding step, an electrode material is formed in film so as to infill the contact holes, after which patterning is conducted on the electrode material to form the source electrode 10 and the gate lead wire 11. Then, the drain electrode 12 is formed on the rear surface of the $n^+$-type substrate 1, thereby completing the MOSFET M1 shown in FIG. 1.

Second Embodiment

A MOSFET M2 of an accumulation-type trench gate structure of a second embodiment according to the present invention will be described below with reference to FIG. 4. The MOSFET M2 of the present embodiment has the same fundamental structure as that of the MOSFET M1 of the first embodiment set forth above. Thus, the MOSFET of the present embodiment will be described below with a focus on points different from the MOSFET M1 of the first embodiment.

Figure 4:
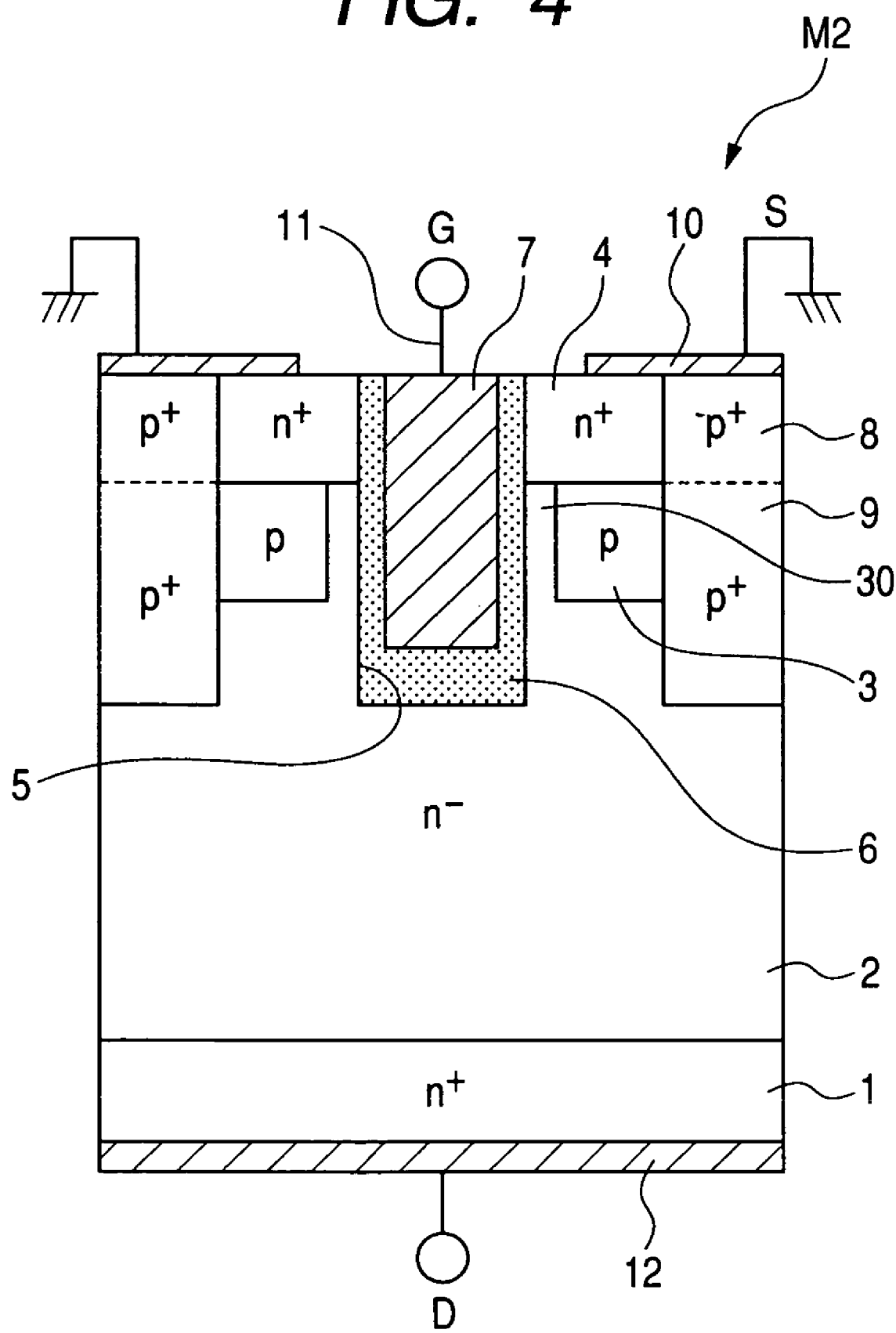
FIG. 4 is a cross-sectional view of a MOSFET of an accumulation-type trench gate structure of a second embodiment according to the present invention.

FIG. 4 is a cross-sectional view of the MOSFET M2 of the accumulation-type trench gate structure of the present embodiment. As will be clear from FIG. 4, the p-type base regions 3 are spaced from the sidewalls of the trench 5 each by a given distance to provide a structure with the n⁻-type drift layer 2 remaining in an n-type channel layer 30.

The MOSFET M2 of such an accumulation-type trench gate structure of the present embodiment will operate in a manner described below.

Under a condition before a gate voltage is applied to the gate electrode 7, first, the SiC has an impurity concentration up to a maximum of a value of $1.0 \times 10^{19}/cm^3$. In this case, the SiC has an intrinsic potential of about 3V and, hence, even if the source electrode 10 lies at 0V, the p-type base regions 3 have behaviors to lie at −3V. Therefore, depletion layers expand from the p-type base regions 3 to cause vicinities of the p-type base regions 3 to behave as insulating bodies. Accordingly, even if the drain electrode 12 is applied with a positive voltage, the n-type channel layers 30 behave as insulating bodies. Thus, no electron can reach the n-type channel layers 30 and, thus, no electric current flows between the source electrode 10 and the drain electrode 12.

Next, during a turned-off state (with a gate voltage=0V, a drain voltage=1200V and a source voltage=0V), applying a voltage to the drain electrode 12 allows depletion layers to expand from between the p-type base regions 3 and the n⁻-type drift layer 2 (involving the n-type channel layers 30). When this takes place, the p-type base regions 3 have an extremely higher concentration than that of the n⁻-type drift layer 2 and, hence, the depletion layers mostly expand to the n⁻-type drift layer 2. When this takes place, since the depletion layers expand in wider areas than those achieved when the drain lies at 0V, areas behaving as the insulating bodies expand in wider areas and, hence, no electric current flows between the source electrode 10 and the drain electrode 12.

Further, since the gate voltage lies at 0V, an electric field occurs between the drain and the gate. This causes an electric field concentration to occur on the bottom wall of the gate oxide film 6. However, the MOSFET M2 takes the form of a structure in which among areas of the gate oxide film 6, an area formed on the bottom wall of the trench 5 has a greater thickness than those of the other areas formed on the sidewalls of the trench 5. In addition, the MOSFET M2 has the p⁺-type deep layers 9 each having a depth equal to or greater than that of the trench 5. Therefore, the depletion layers, each present at a PN junction between the p⁺-type deep layer 9 and the n⁻-type drift layer 2, remarkably extend into the n⁻-type drift layer 2 and, thus, a high voltage, resulting from an affect caused by the drain voltage, is hardly applied to the gate oxide film 6.

This makes it possible to alleviate the occurrence of the electric field concentration in the gate oxide film 6, i.e., the electric field concentration at, especially, the bottom wall of the trench 5 among the areas of the gate oxide film 6. This results in a capability of preventing the gate oxide film 6 from being damaged.

Upon confirming the occurrence of electric field intensity under simulations, if the drain electrode 12 was applied with 1200V, among the areas of the gate oxide film 6, the area of the gate oxide film 6, formed at the bottom wall of the trench 5, had an electric field intensity of 4.3 MV/cm. This electric field intensity remained at a level in which no breakdown of the gate oxide film 6 occurred with the electric field concentration. Therefore, even if the drain electrode 12 is applied with 1200V, the gate oxide film 6 is not ruptured and can achieve a withstand voltage of 1200V.

Meanwhile, during a turned-on state (with the gate voltage=20V, the drain voltage=2V and the source voltage=0V), the gate electrode 7 is applied with a gate voltage of 20V and the n-type channel layers 30 function as accumulation-type channels. Thus, electrons, charged from the source electrode 10, pass from the n⁺-type source regions 4 to the n-type channel layers 30 and subsequently reach the n⁻-type drift layer 2. This enables an electric current to flow between the source electrode 10 and the drain electrode 12. In addition, calculating the resistance revealed a value of 1.9 mΩ·cm².

Thus, the MOSFET M2 of the accumulation-type trench gate structure can have the same advantageous effects as those of the MOSFET M1 of the first embodiment.

Figure 5A:
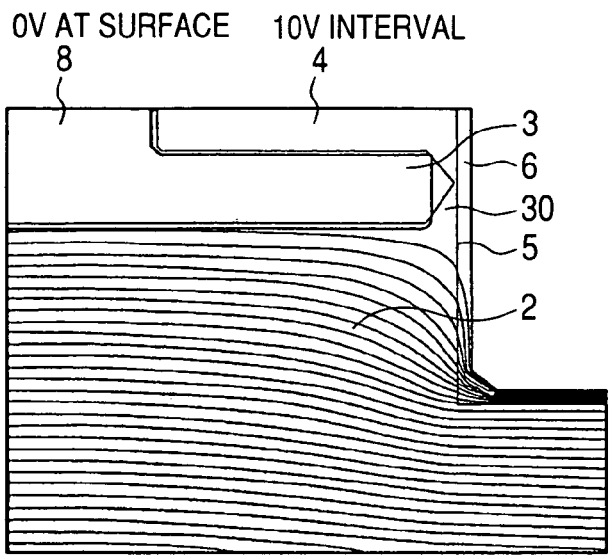
FIGS. 5A to 5C are cross-sectional views showing electric field distribution patterns on a simulation when assumed that a drain electrode is applied with 1200V.
Figure 5B:
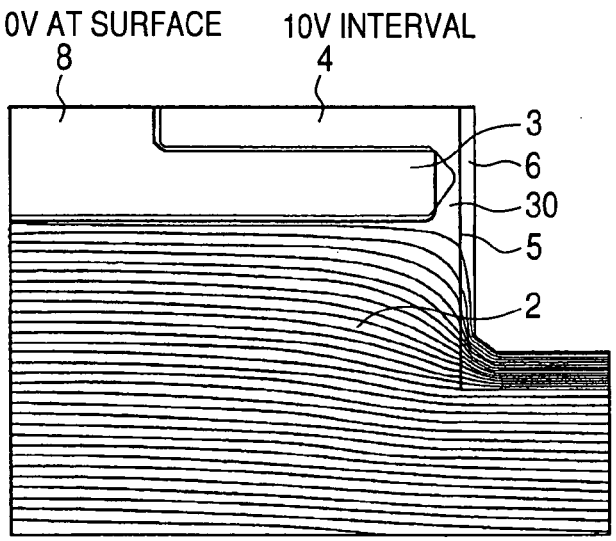
Figure 5C:
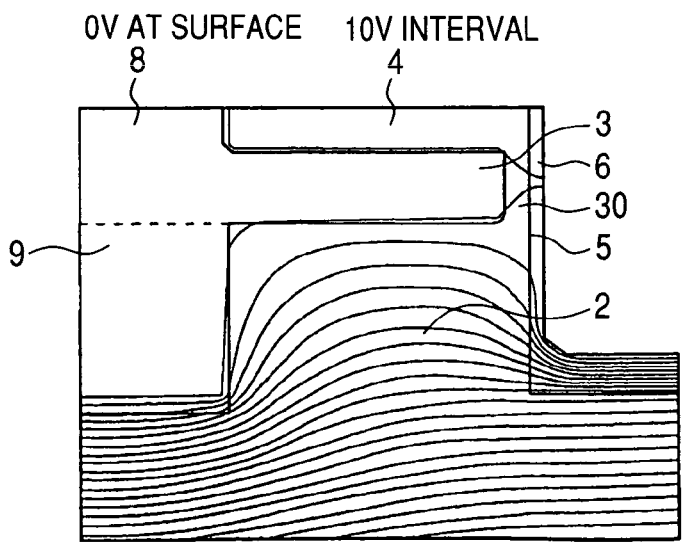
Figure 6A:
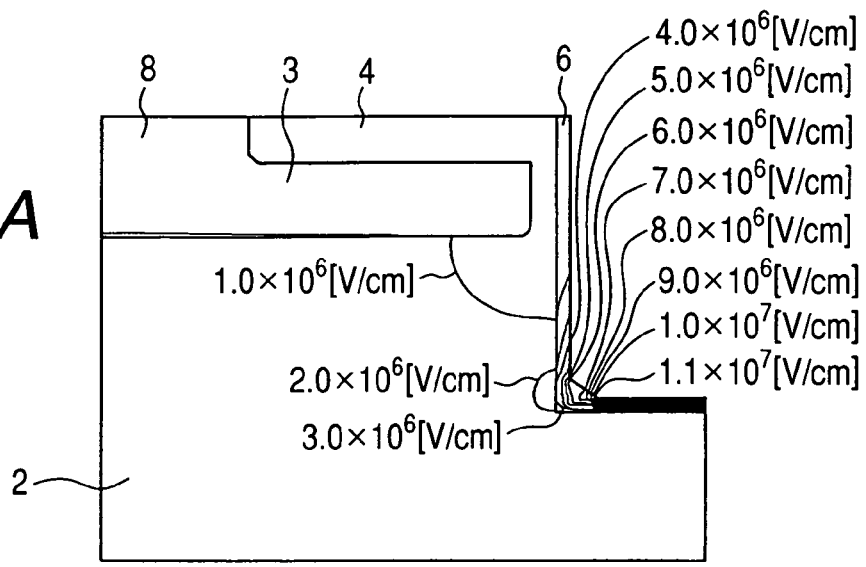
FIGS. 6A to 6C are cross-sectional views showing other electric field distribution patterns on the simulation when assumed that the drain electrode is applied with 1200V.
Figure 6B:
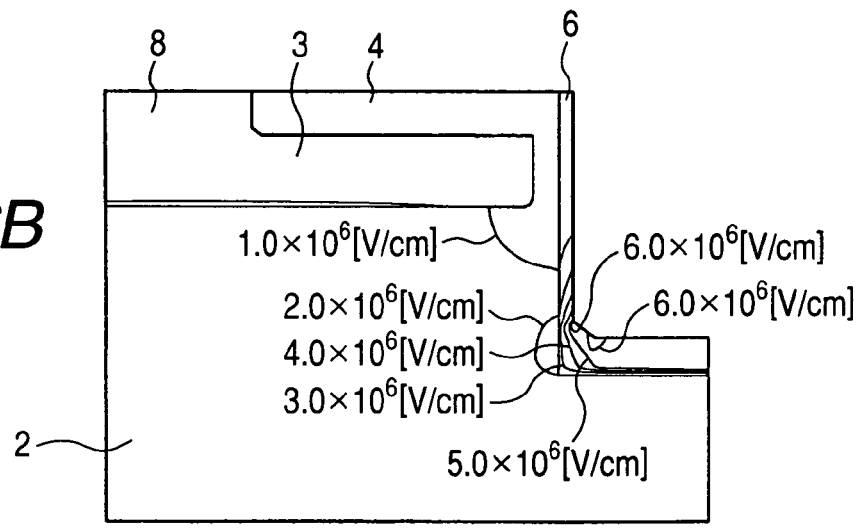
Figure 6C:
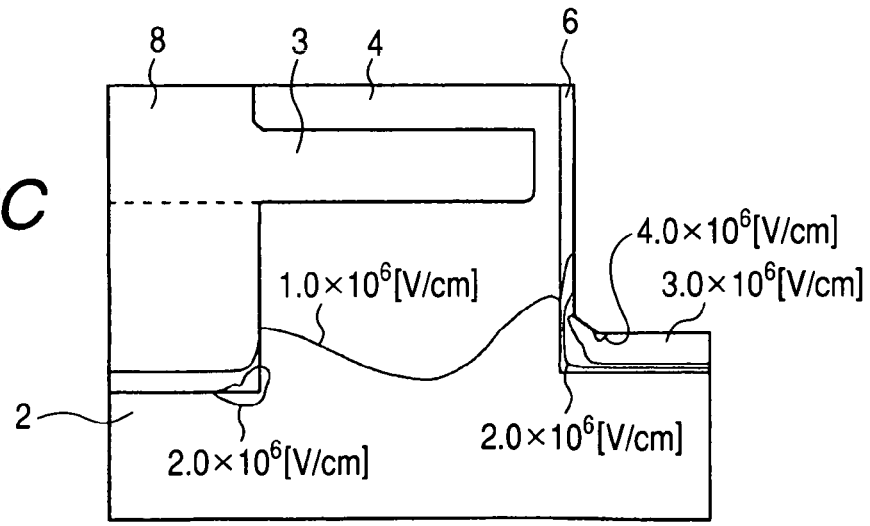

For reference, a simulation was conducted on a voltage potential distribution and an electric field distribution for a case in which the drain electrode 12 was applied with 1200V. Results are shown in FIGS. 5A to 5C and FIGS. 6A to 6C. FIGS. 5A to 5C are views showing the voltage potential distributions indicated on equipotential lines with a distance of 10V while the p-type base region 3 and the p⁺-type deep layer 9 have surfaces (on an uppermost part) of 0V. FIGS. 6A to 6C are views showing the electric field distributions. In FIGS. 5A to 5C and FIGS. 6A to 6C, affixes "A", "B" and "C" represent a first case in which the gate oxide film 6 has the same film thickness as those of the sidewall and the bottom wall of the trench 5 with no formation of the p⁺-type deep layer 9, a second case in which the gate oxide film 6 has a greater film thickness on the bottom wall of the trench 5 than that of the sidewall with no formation of the p⁺-type deep layer 9, a third case in which, like the MOSFET M2 of the present embodiment, the gate oxide film 6 has a greater film thickness on the bottom wall of the trench 5 than that of the sidewall with the p⁺-type deep layer 9 being formed.

As shown in FIG. 5A, in a case where the gate oxide film 6 has the same film thickness over the areas present on the sidewall and the bottom wall of the trench 5 and no p⁺-type deep layer 9 is formed, it is apparent that the gate oxide film 6 has equipotential lines extremely narrowed in distance. As shown in FIG. 5B, on the contrary, permitting the gate oxide film 6 to have the greater film thickness on the bottom wall of the trench 5 than that on the sidewall thereof enables the gate oxide film 6 to have the equipotential lines expanded in distance. However, since no p⁺-type deep layer 9 is formed, the gate oxide film 6 is still hard to obtain the equipotential lines spaced in adequate distance. Like the MOSFET M2 of the present embodiment as shown in FIG. 5C, in contrast, forming the p⁺-type deep layer 9 while permitting the gate oxide film 6 to have the greater film thickness on the bottom wall of the trench 5 than that on the sidewall thereof enables the gate oxide film 6 to have the equipotential lines spaced in adequate distance.

As shown in FIG. 6A, further, in a case where the gate oxide film 6 has the same film thickness over the areas present on the sidewall and the bottom wall of the trench 5 and no p⁺-type deep layer 9 is formed, it will be apparent that the electric field concentration occurs in the gate oxide film 6. As shown in FIG. 6B, furthermore, causing the gate oxide film 6 to have the greater film thickness on the bottom wall of the trench 5 than that on the sidewall thereof enables the gate oxide film 6 to have a reduced electric field concentration. However, since the p+-type deep layer 9 is not formed, the gate oxide film 6 has an inadequate field-concentration reducing effect. In contrast to these cases, as shown in FIG. 6C, forming the p+-type deep layer 9 while permitting the gate oxide film 6 to have the greater film thickness on the bottom wall of the trench 5 than that on the sidewall thereof enables the gate oxide film 6 to have the electric field concentration reduced to an adequately lower level.

Also, the method of manufacturing the MOSFET M2 of such a trench gate structure set forth above may suffice to be carried out merely by altering the mask pattern for the p-type base regions 3 to be formed in contrast to the method of manufacturing the MOSFET M1 of the first embodiment.

Third Embodiment

A MOSFET M3 of an accumulation-type trench gate structure of a third embodiment according to the present invention will be described below with reference to FIG. 7. The MOSFET M3 of the present embodiment differs from the MOSFET M2 of the trench gate structure of the second embodiment in respect of reserve layers being additionally provided. The MOSFET M3 of the present embodiment has the same fundamental structure as that of the MOSFET M2 of the second embodiment and, hence, description will be made with a focus on such a differing point.

Figure 7:
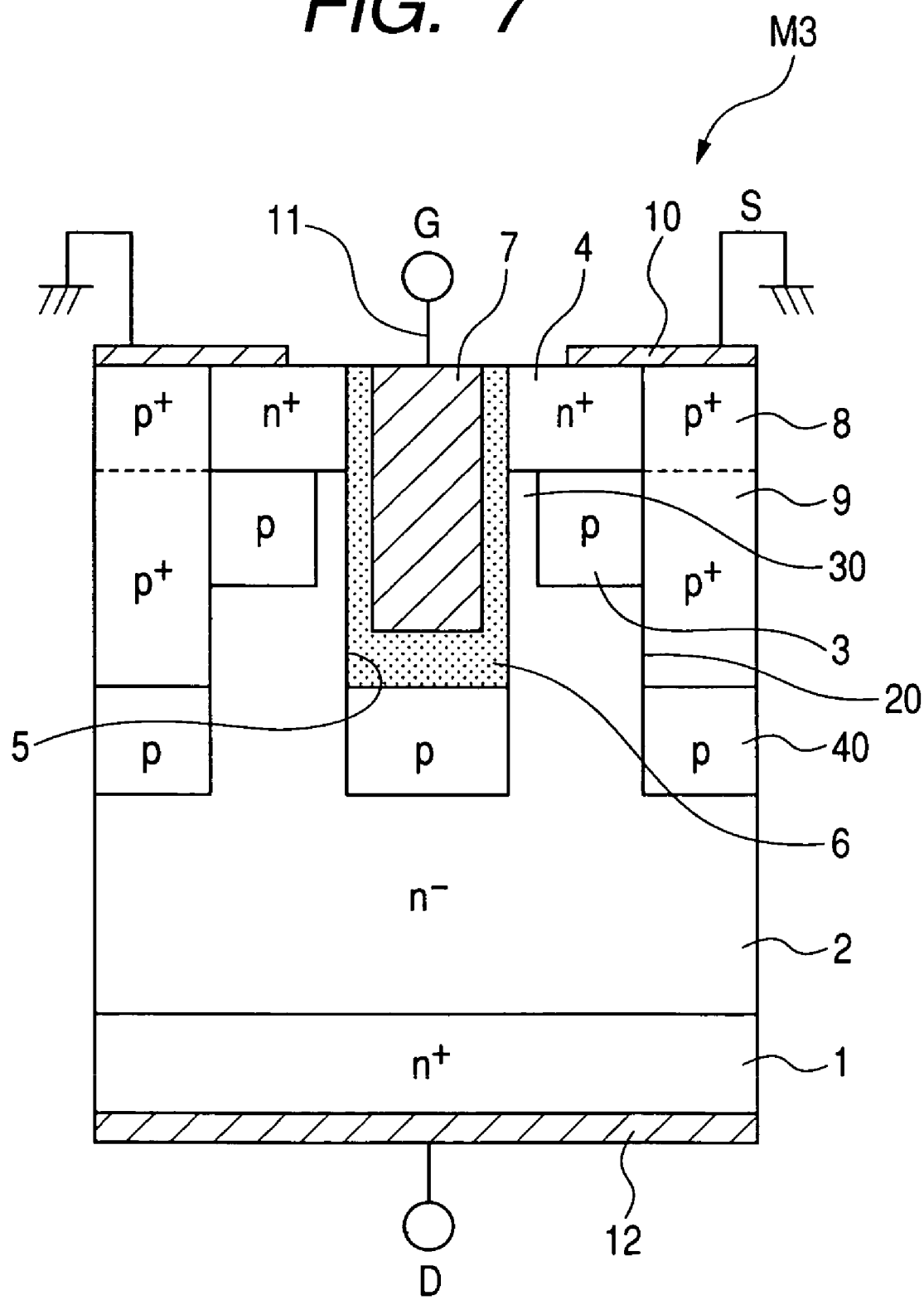
FIG. 7 is a cross-sectional view of a MOSFET of an accumulation-type trench gate structure of a third embodiment according to the present invention.

FIG. 7 is a cross-sectional view of the MOSFET M3 of the accumulation-type trench gate structure of the present embodiment. As will be clear from FIG. 7, the MOSFET M3 of the present embodiment has areas, placed beneath the p+-type deep layers 9 at positions below the bottom wall of the trench layer 5, which have p-type reserve regions 40. Each of the p-type reserve regions 40 has a lower concentration than that of the p+-type deep layer 9. The p-type reserve regions 40 are formed in a depth position of, for instance, 0.7 μm from a lower portion of the p+-type deep layers 9 and a lower portion of the trench layer 5 with a p-type impurity concentration of $1 \times 10^{17}/cm^3$.

Providing such p-type reserve regions 40 results in a capability of achieving a further reduction in electric fields present in the areas beneath the trench gate 5. This enables the gate oxide film 6 to lower an electric field intensity to a level of 2.3 MV/cm under a situation where the drain electrode 12 is applied with 1200V. Further, the p-type reserve regions 40 have functions to alleviate electric fields of depletion layers in the SiC, making it possible to increase a withstand voltage up to a level of 1360V. In addition, calculating the resistance in this case revealed a value of 3.3 mΩ·cm².

Figure 8A:
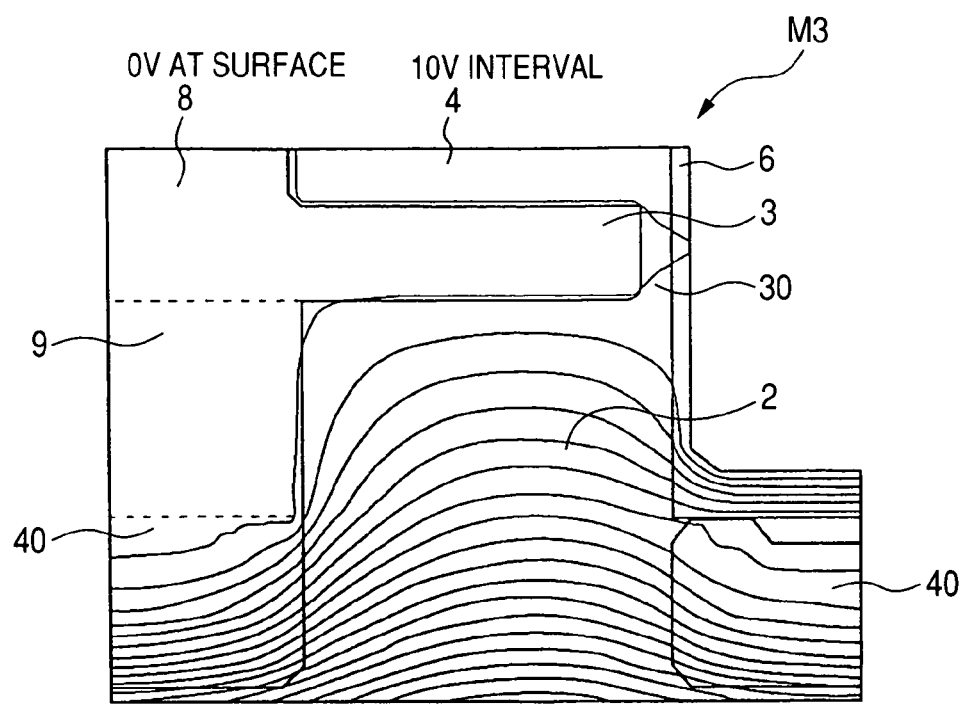
FIGS. 8A and 8B represent electric field distribution patterns on the simulation when assumed that the drain electrode is applied with 1200V.
Figure 8B:
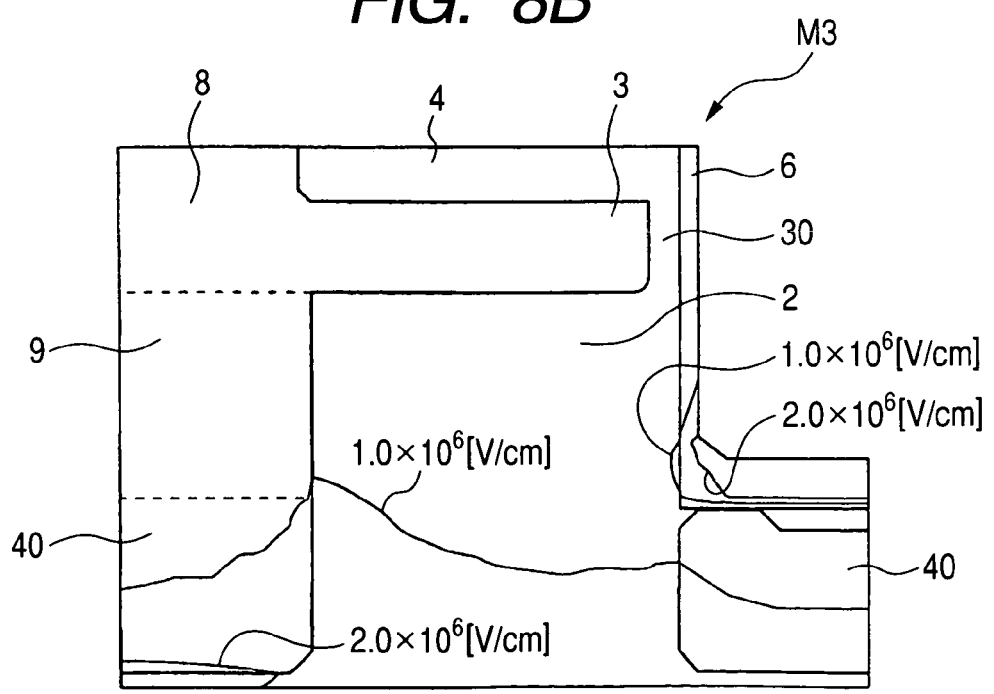

For reference, simulations were conducted on the MOSFET M3 of such a structure to check a voltage potential distribution and an electric field distribution for a case in which the drain electrode 12 was applied with 1200V. Results are shown in FIGS. 8A and 8B. As shown in FIGS. 8A and 8B, the MOSFET M3 of the present embodiment makes it possible to have the gate oxide film 6 having the voltage potential distribution in adequately widened equipotential lines than those achieved in the MOSFET in which the p-type reserve layers 40, shown in FIG. 5C, are not formed. In addition, the MOSFET M3 of the present embodiment can adequately alleviate the electric field concentration in the gate oxide film 6 in a further effective fashion than that achieved in the MOSFET in which the p-type reserve layers 40, shown in FIG. 6C, are not formed.

Further, the MOSFET M3 of such a trench structure can be obtained by merely adding several steps to those of the method of manufacturing the MOSFET M2 of the second embodiment shown in FIG. 2. These steps include forming the trench 5 and the trenches 20 for forming the p-type deep layers 9 on the MOSFET M2, placing a mask on the MOSFET to cover an area except for the trench 5 and the trenches 20 and, subsequently, ion implanting a p-type impurity onto bottom walls of the trench 5 and the trenches 20 with the activation being subsequently conducted.

Fourth Embodiment

A MOSFET M4 of an accumulation-type trench gate structure of a fourth embodiment according to the present invention will be described below with reference to FIG. 9. The MOSFET M4 of the present embodiment differs from the MOSFET M3 of the accumulation-type trench gate structure of the third embodiment in that the MOSFET M4 of the present embodiment has areas provided with low resistance layers. The MOSFET M4 of the present embodiment has the same fundamental structure as that of the MOSFET M3 of the third embodiment and, hence, description will be will be made with a focus on only such a differing point.

Figure 9:
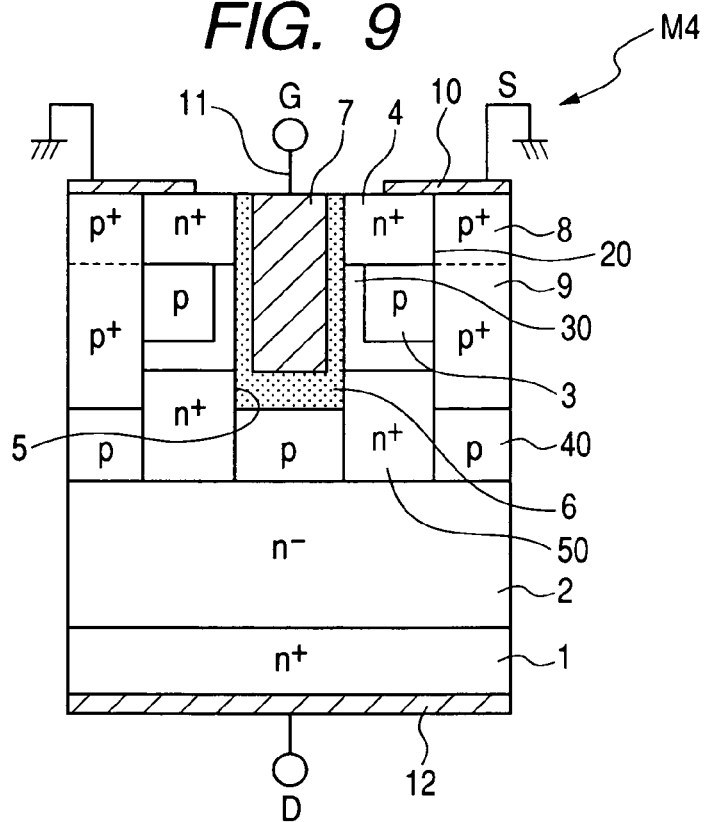
FIG. 9 is a cross-sectional view of a MOSFET of an accumulation-type trench gate structure of a fourth embodiment according to the present invention.

FIG. 9 is a cross-sectional view of the MOSFET M4 of the accumulation-type trench gate structure of the present embodiment. As shown in FIG. 9, the MOSFET M4 further includes n+-type low resistance layers 50 each formed in an area below the p-type base region 3 at a position spaced therefrom and between at least the p+-type deep layer 9 and the trench 5 (also between the gate oxide film 6 and the reserve layer 40). The n+-type low resistance layer 50 has the same concentration as that of, for instance, the n+-type source region 4.

Forming such n+-type low resistance layers 50 in the MOSFET M4 enables the same to have the n⁻-type drift layer 2 with low resistance, making it possible to lower on resistance.

Further, the MOSFET M4 of such an accumulation-type trench gate structure of the present embodiment can be manufactured in an easy manner. That is, during the formation of the n⁻-type drift layer 2, increasing a concentration of the n⁻-type drift layer 2 in localized film areas such that the n+-type low resistance layers 50 are formed with higher concentrations. In this case, the trench 5, the p+-type deep layers 9 and the p-type reserve layers 40 are formed in a layout as shown in FIG. 9, thereby enabling the MOSFET M4 to be manufactured.

Fifth Embodiment

A MOSFET M5 of an accumulation-type trench gate structure of a fifth embodiment according to the present invention will be described below with reference to FIG. 10. The MOSFET M5 of the present embodiment differs from the MOSFET M2 of the accumulation-type trench gate structure of the second embodiment in that the MOSFET M5 of the present embodiment further includes an n-type channel layer 30 formed by epitaxial growth. Accordingly, the MOSFET M5 of the present embodiment has the same fundamental structure as that of the MOSFET M2 of the second embodiment and, hence, description will be will be made with a focus on only such a differing point.

Figure 10:
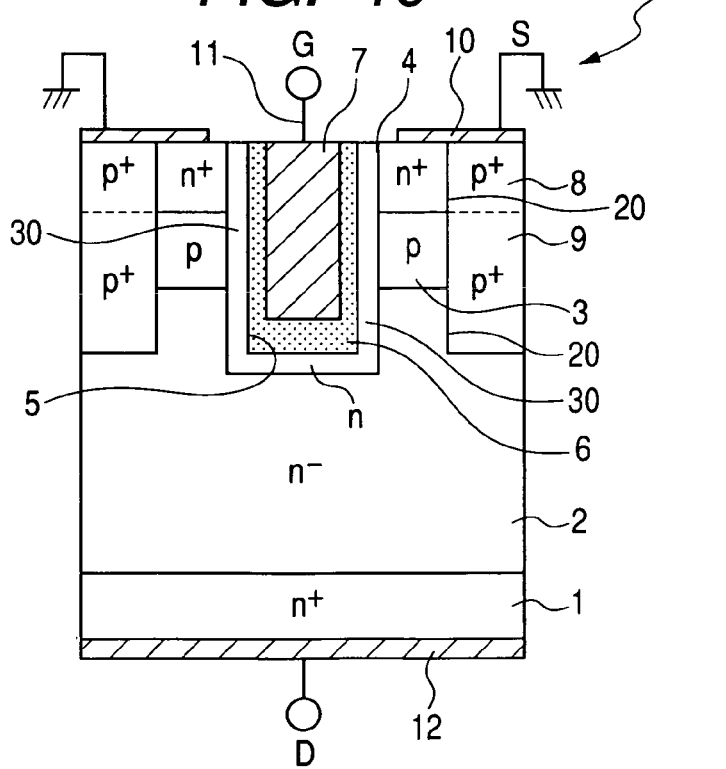
FIG. 10 is a cross-sectional view of a MOSFET of an accumulation-type trench gate structure of a fifth embodiment according to the present invention.

FIG. 10 is a cross-sectional view of the MOSFET M5 of the accumulation-type trench gate structure of the present embodiment. As shown in FIG. 10, the MOSFET M5 includes the n-type channel layer 30 with a given film thickness that is formed in an overall area covering the bottom wall and the sidewalls of the trench 5. The n-type channel layer 30 has a surface on which the gate oxide film 6 is formed. Even with such a structure, the MOSFET M5 of the accumulation-type trench gate structure of the present embodiment has the same advantageous effects as those of the MOSFETs of the second to fourth embodiments. In addition, with the MOSFET M5 of the present embodiment, since the concentration of the n-type channel layer 30 can be controlled independently of the n⁻-type drift layer 2, the concentration of the n-type channel layer 30 can have a higher concentration of impurity than that of the n⁻-type drift layer 2. That is, the n-type channel layer 30 can be formed with an impurity concentration of, for instance, $2.0 \times 10^{16}/cm^3$. This enables a reduction in on resistance to a lower level than that achieved when the n-type channel layer 30 has the same concentration as that of the n⁻-type drift layer 2 when it has the impurity concentration of $8.0 \times 10^{15}/cm^3$. With the n-type channel layer 30 formed with such an impurity concentration, the n-type channel layer 30 has an on resistance of 1.7 mΩ·cm², making it possible to achieve a further reduction in on resistance than that of the MOSFET M2 of the second embodiment.

The MOSFET M5 of such an accumulation-type trench gate structure of the present embodiment can be manufactured in the approximately same manufacturing method as that described above with reference to the first embodiment. That is, upon conducting the steps shown in FIG. 3B, the trench 5 is formed with an n-type impurity layer by epitaxial growth, after which it may suffice for the gate oxide film 6 and the gate electrode 7 to be formed on the surfaces of the n-type channel layers 30. However, when forming the n-type channel layers 30 in the epitaxial growth, the substrate surface is also formed with the n-type channel layer 30. Thus, it may be preferable to conduct a step of removing the n-type channel layer 30 from the substrate surface. However, the step of forming the contact hole enables the n⁺-type source regions 4 and the p⁺-type contact regions 8 to be electrically connected to each other via the n-type channel layers 30. Thus, it doesn't matter if the n-type channel layers 30 are left intact.

Further, although the MOSFET 5 has been described above as a modified form of the second embodiment with the n-type channel layers 30 formed in the epitaxial growth, it will be appreciated that the MOSFETs of the third and fourth embodiments may also have the n-type channel layers 30 to be formed by epitaxial growth.

Sixth Embodiment

Figure 11:
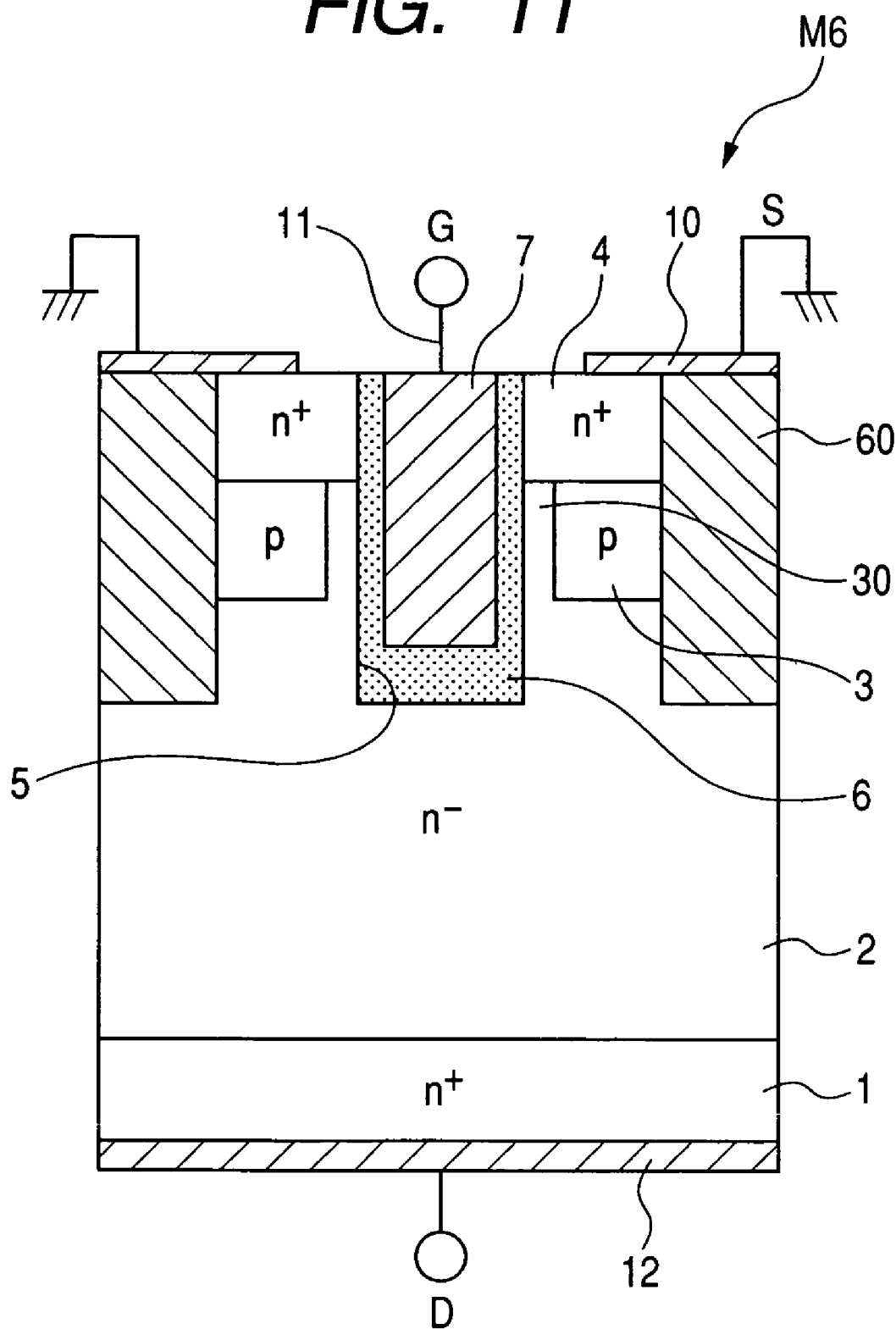
FIG. 11 is a cross-sectional view of a MOSFET of an accumulation-type trench gate structure of a sixth embodiment according to the present invention.

A MOSFET M6 of an accumulation-type trench gate structure of a sixth embodiment according to the present invention will be described below with reference to FIG. 11. The MOSFET M6 of the present embodiment differs from the MOSFET M2 of the accumulation-type trench gate structure of the second embodiment in that the MOSFET M6 of the present embodiment includes metallic layers each in the form of a Schockley diode provided in place of the p⁺-type contact layers 8 and the p⁺-type deep layers 9. Each of the metallic layers 50 is made of material such as, for instance, Ti or Ni with a work function difference between the metallic layer 50 and the n⁻-type drift layer 2 permitting the Schockley diode to be formed. With the MOSFET M6 formed with the Schockley diodes, even if the drain electrode of the MOSFET M6 is applied with a positive voltage, no probability takes place for an electric current to flow from the n⁻-type drift layer 2 to the source electrode 10 provided that the positive voltage is 1200V or less.

With the MOSFET M6 of such a structure, since the MOSFET M6 includes PN diodes provided in the form of the Schockley diodes, the MOSFET M6 can be formed in a structure having a high withstand surge current.

Next, the MOSFET M6 of such a trench gate structure will be described below. The MOSFET M6 of such a trench gate structure can be manufactured in the same method as those of manufacturing the MOSFETs of the first and second embodiments. Therefore, the method of manufacturing the MOSFET M6 of the present embodiment will be described mainly with a focus on points different from those of the first and second embodiments to omit redundant description on the same parts.

Figure 12A:
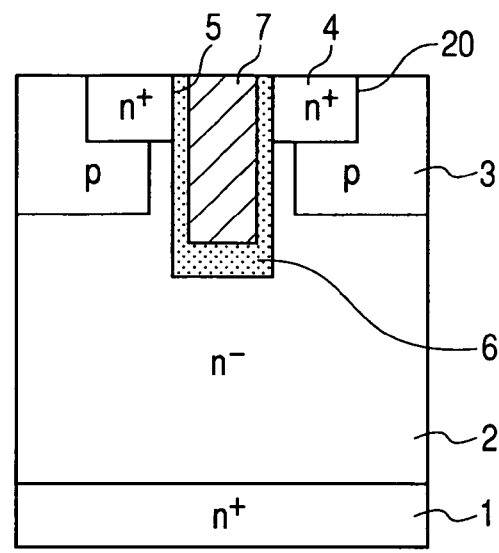
FIGS. 12A to 12C are cross-sectional views showing how the trench gate type MOSFET, shown in FIG. 11, is manufactured.
Figure 12B:
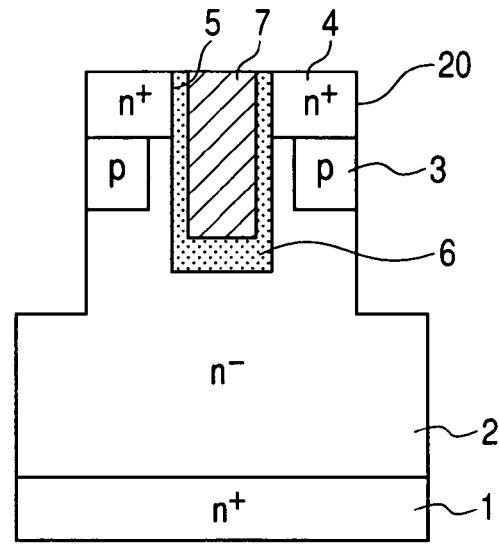
Figure 12C:
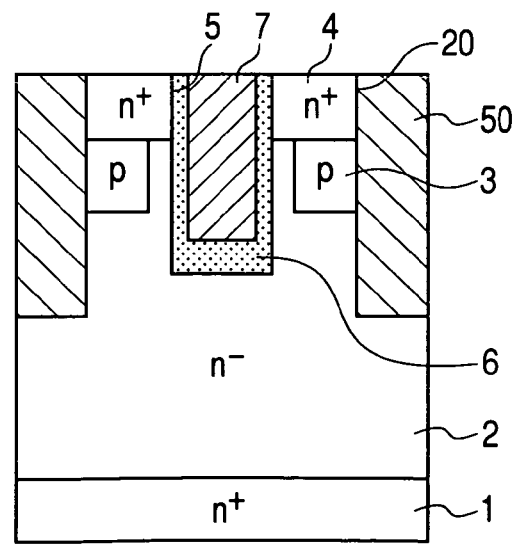

FIGS. 12A to 12C are cross-sectional views, showing a part of steps for manufacturing the MOSFET M6 of the accumulation-type trench gate structure of the present embodiment, which represent only a part of the MOSFET M6 in areas different from that of the first embodiment.

First, the re-type drift layer 2 is formed on the n⁺-type substrate 1 by epitaxial growth, after which the p-type base regions 3 and the n⁺-type source regions 4 are formed on the n⁻-type drift layer 2 upon using a mask. Then, only the trench 5 is formed in the n⁻-type drift layer 2 by etching with the use of a mask (not shown). Thereafter, the gate oxide film 6 and the gate electrode 7 are formed in the trench 5 as shown in FIG. 12A. In succeeding step, as shown in FIG. 12B, the trenches 20 are formed in forming scheduled regions for the metallic layers 60 by etching with the use of a mask (not shown). As shown in FIG. 12C, thereafter, the metallic layers 60 are infilled in the trenches 20 for placements therein. Subsequently, conducting the same steps as those of the first and second embodiments enables the MOSFET M6 of the present embodiment to be manufactured.

When using such a manufacturing method, the metallic layers 60 may be parts of the source electrodes 10 and, hence, the metallic layers 50 have no need to be flattened. Therefore, a grinding step for the flattening can be omitted, thereby providing a simplified manufacturing process. Accordingly, this minimizes the occurrence of damage to the MOSFET, permitting the MOSFET to have a further increased operating quality.

While the MOSFET M6 of the accumulation-type trench gate structure of the present embodiment has been described above with reference to a structure in which the metallic layers 50 are applied to the MOSFET M2 of the accumulation-type trench gate structure of the second embodiment, the concept of the present invention may be applied to the structures of the MOSFETs of the first, third and fourth embodiments.

Other Embodiments (1) While the present invention has been described above with reference to the various embodiments related to examples of the n-channel type MOSFETs in which the first electrically conductive type is of the n-type and the second electrically conductive type is of the p-type, the present invention may be applied to a MOSFET of a p-channel type with various component elements being inverted in electrically conductive types. Further, although the present invention has been described above with reference to the examples of the MOSFETs of the trench gate structure, the present invention may be applied to an IGBT (Insulated Gate Bipolar Transistor) of a similar trench structure. The IGBT can be obtained by merely altering the MOSFETs so as to convert the n-type of the electrically conductive type of the substrate 1 to the p-type in the first to fourth embodiments with other parts having the same structures as those of the MOSFETs of the first to fourth embodiments and manufactured in the same method as those of the first and fourth embodiments.

(2) Furthermore, although the present invention has been described above with reference to the first embodiment in which the trench 5 and the trenches 20, for the p+-type deep layers 9 to be formed, are concurrently prepared, it doesn't matter if these parts are separately formed. In this case, it doesn't matter if any of the trenches 5 and 20 is formed first. In this case, only the trenches 20 may be formed first, after which p+-type layers 22 are formed on the trenches 20 before forming the trench 5 and subjected to CMP (Chemical Mechanical Polishing) grinding to allow only the p+-type layers 22 to be left. This enables a process to be preferably implemented on the ground of infilling the trenches 20 with the p+-type layers 22.

(3) Moreover, while with the first to third embodiments, the p-type base regions 3 and the n+-type source regions 4 are formed before the trench 5 is formed, the p-type base regions 3 and the n+-type source regions 4 may be formed after the trench 5 is formed.

(4) While the third embodiment has been described above with reference to the MOSFET of the accumulation-type trench gate structure on which the p-type reserve layers 40 are formed, the p-type reserve layers 40 may be formed on the MOSFET of the inversion-type trench gate structure like that of the first embodiment.

(5) While the various embodiments have been described above with reference to the case wherein the p-type base regions 3 and the n+-type source regions 4 are formed by ion-implantation, these regions may be provided by sequentially forming a p-type layer and an n-type layer on the n−-type drift layer 2. In this case, the trenches 20 may be provided to form the p+-type deep layers 9 after the n+-type source regions 4 are formed. In an alternative, it may be possible to take technique of forming the p+-type deep layers 9 by ion-implantation after the formation of the p-type base regions and subsequently forming the p+-type contact regions 8 by ion-implantation after the formation of the n+-type source regions 4.

(6) While the various embodiments have been described above with reference to the case wherein the trench 5 is formed with the sidewall oriented in the [11-20] direction upon using the (000-1) c-plane, the gate oxide film 6 may be formed with a thickness greater than that of the sidewall at the bottom wall of the trench 5 even when the trench 5 is formed in the [1-100] direction with the use of a (0001) Si-plane. Even with such a structure, adopting the same structures as those of the various embodiments set forth above enables the same advantageous effects as those of the various embodiments to be obtained.

However, when using the (0001) Si-plane, an oxidizing rate is one-half of an "a"-plane. Therefore, when forming the gate oxide film 6 only by thermal oxidation, the gate oxide film 6 has the sidewall whose thickness is one-half of the thickness of the bottom wall of the trench 5. Accordingly, the gate oxide film 6 may be prepared by thermal oxidation to allow the sidewall of the bottom wall of the trench 5 to reach a thickness of 20 nm while the remnant part of 80 nm can be prepared by a CVD (Chemical Vapor Deposition) method. In using the CVD, a film thickness, when a film is formed, is independent of a plane direction and, hence, the gate oxide film 6 has the same thickness as that of the bottom wall of the trench 5. This allows the gate oxide film 6 to have a thickness of 90 nm, involving the film thickness caused by thermal oxidation, at the bottom wall of the trench 5.

However, with the n−-type drift layer 2 and the p+-type deep layers 9 of the MOSFET M2 of the second embodiment, such a film thickness of the gate oxide film 6 causes an increase in an electric field intensity in the gate oxide film 6 at the bottom wall of the trench 5, resulting in degraded withstand voltage. In order to obtain the same withstand voltage and electric field intensity of the MOSFET M2 of the second embodiment, therefore, the depth of the p+-type deep layers 9 may be preferably made to be deeper by a value of 1.5 μm and the n−-type drift layer 2 may be preferably made to have a concentration altered from a value of $8.0 \times 10^{15}/cm^3$ to a value of $5.0 \times 10^{15}/cm^3$. With such an alteration, on resistance, having a value of 1.9 mΩ·cm$^2$, increases to a value of 2.7 mΩ·cm$^2$.

Further, when indicating a crystal orientation, although a bar (-) needs to be affixed to a given numeral under normal circumstances, there is a limitation in an expression when filing a patent application based on a personal computer. Therefore, with the specification of the present patent application, the bar is affixed to the given numeral in front thereof.

While the specific embodiments of the present invention have been described above in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention, which is to be given the full breadth of the following claims and all equivalents thereof.

What is claimed is:

1. A silicon carbide semiconductor device, which is an inversion-type trench gate structure MOSFET, comprising:
    a first or second electrically conductive type substrate made of 4H silicon carbide and having a surface on one of a (000-1) c-plane and a (0001) Si-plane;
    a drift layer formed on the substrate with the first electrically conductive type silicon carbide having a lower impurity concentration than that of the substrate;
    a trench formed with a surface of the drift layer and having sidewalls formed with surfaces extending in one of a [11-20] direction and a [1-100] direction;
    base regions, formed in the drift layer in areas on both sides of the trench such that the trench is sandwiched and held in contact with the sidewalls of the trench, the base regions being made of the second electrically conductive type silicon carbide;
    source regions, formed on upper layer portions of the base regions in contact with the sidewalls of the trench such that the trench is sandwiched, which are made of the first electrically conductive type silicon carbide having a higher concentration than that of the drift layer;
    a gate oxide film, formed on an upper area of a bottom wall of the trench upon thermally oxidizing a surface of the trench, which has a thickness greater than that of each sidewall of the trench;
    a gate electrode formed in the trench in an area above the gate oxide film;
    a first electrode electrically connected to the source regions, respectively;
    a second electrode formed on the substrate at a rear surface thereof;
    second electrically conductive type deep layers formed on the drift layer in areas spaced from the trench with the base regions being intervened each in a depth equal to or greater than a depth of the trench and having a concentration equal to or greater than that of the base regions; and
    channel regions formed on surface areas of the base regions to allow an electric current to flow between the first and second electrodes via the source regions and the drift layer and upon controlling a voltage applied to the gate electrode.

2. The silicon carbide semiconductor device according to claim 1, further comprising:
low resistance regions, formed on the drift layer in areas each between the sidewall of the trench and the deep layer, each of which has a higher concentration than that of the drift layer.

3. A silicon carbide semiconductor device, which is an accumulation-type trench gate structure MOSFET, comprising:
a first or second electrically conductive type substrate made of 4H silicon carbide and having a surface on one of a (000-1) c-plane and a (0001) Si-plane;
a drift layer formed on the substrate with the first electrically conductive type silicon carbide having a lower impurity concentration than that of the substrate;
a trench formed with a surface of the drift layer and having sidewalls formed with surfaces extending in one of a [11-20] direction and a [1-100] direction;
base regions, formed in the drift layer in areas on both sides of the trench such that the trench is sandwiched, which are made of the second electrically conductive type silicon carbide;
source regions, formed on upper layer portions of the base regions in contact with the sidewalls of the trench such that the trench is sandwiched, which are made of the first electrically conductive type silicon carbide having a higher concentration than that of the drift layer;
a gate oxide film, formed on an upper area of a bottom wall of the trench upon thermally oxidizing a surface of the trench, which has a thickness greater than that of each sidewall of the trench;
a gate electrode formed in the trench in an area above the gate oxide film;
a first electrode electrically connected to the source regions, respectively;
a second electrode formed on the substrate at a rear surface thereof;
second electrically conductive type deep layers formed on the drift layer in areas spaced from the trench with the base regions being intervened each in a depth equal to or greater than a depth of the trench and having a concentration equal to or greater than that of the base regions; and
channel regions formed on surface areas of the base regions to allow an electric current to flow between the first and second electrodes via the source regions and the drift layer, wherein
the channel regions include first electrically conductive type channel layers, formed on surfaces of the trench in contact with the sidewalls of the trench so as to straddle the drift layer and the source regions, which are made of silicon carbide.

4. The silicon carbide semiconductor device according to claim 3, further comprising:
second electrically conductive type contact regions, spaced in placement from the trench so as to sandwich the source regions to allow the base regions to be electrically connected to the first electrode, each of which has a higher concentration than that of each of the base regions; and
wherein the deep layers are placed beneath the contact regions to be unitarily formed wits the contact regions, respectively.

5. The silicon carbide semiconductor device according to claim 4, wherein:
each of the deep layers has a second electrically conductive type impurity concentration ranging from $1.0 \times 10^{17}/cm^3$ to $1.0 \times 10^{20}/cm^3$.

6. The silicon carbide semiconductor device according to claim 4, wherein:
each of the deep layers has a depth ranging from 1.5 to 3.5 μm starting from a surface of each of the base regions.

7. The silicon carbide semiconductor device according to claim 3, further comprising:
low resistance regions, formed on the drift layer in areas each between the sidewall of the trench and the deep layer, each of which has a higher concentration than that of the drift layer.

8. A silicon carbide semiconductor device comprising:
a first or second electrically conductive type substrate made of 4H silicon carbide and having a surface on one of a (000-1) c-plane and a (0001) Si-plane;
a drift layer formed on the substrate with the first electrically conductive type silicon carbide having a lower impurity concentration than that of the substrate;
a trench formed with a surface of the drift layer and having sidewalls formed with surfaces extending in one of a [11-20] direction and a [1-100] direction;
base regions, formed in the drift layer in areas on both sides of the trench such that the trench is sandwiched, which are made of the second electrically conductive type silicon carbide;
source regions, formed on upper layer portions of the base regions in contact with the sidewalls of the trench such that the trench is sandwiched, which are made of the first electrically conductive type silicon carbide having a higher concentration than that of the drift layer;
a gate oxide film, formed on an upper area of a bottom wall of the trench upon thermally oxidizing a surface of the trench, which has a thickness greater than that of each sidewall of the trench;
a gate electrode formed in the trench in an area above the gate oxide film;
a first electrode electrically connected to the source regions, respectively;
a second electrode formed on the substrate at a rear surface thereof;
second electrically conductive type deep layers formed on the drift layer in areas spaced from the trench with the base regions being intervened each in a depth equal to or greater than a depth of the trench and having a concentration equal to or greater than that of the base regions;
second electrically conductive type reserve layers, formed on the drift layer in areas below the trench and the deep layers, respectively, each of which has a lower concentration than that of each of the deep layers; and
channel regions formed on surface areas of the base regions to allow an electric current to flow between the first and second electrodes via the source regions and the drift layer.

9. The silicon carbide semiconductor device according to claim 8, further comprising:
low resistance regions, formed in areas each between the sidewall of the trench, the deep layer and the reserve layer, each of which has a higher concentration than that of the drift layer.

10. A silicon carbide semiconductor device, which is an inversion-type trench gate structure MOSFET, comprising:

a first or second electrically conductive type substrate made of 4H silicon carbide and having a surface on one of a (000-1) c-plane and a (0001) Si-plane;

a drift layer formed on the substrate with the first electrically conductive type silicon carbide having a lower impurity concentration than that of the substrate;

a trench formed with a surface of the drift layer and having sidewalls formed with surfaces extending in one of a [11-20] direction and a [1-100] direction;

base regions formed in the drift layer in areas on both sides of the trench such that the trench is sandwiched, the base regions being held in contact with the sidewalls of the trench and being made of the second electrically conductive type silicon carbide;

source regions, formed on upper layer portions of the base regions in contact with the sidewalls of the trench such that the trench is sandwiched, which are made of the first electrically conductive type silicon carbide having a higher concentration than that of the drift layer;

a gate oxide film, formed on an upper area of a bottom wall of the trench upon thermally oxidizing a surface of the trench, which has a thickness greater than that of each sidewall of the trench;

a gate electrode formed in the trench in an area above the gate oxide film;

a first electrode electrically connected to the source regions, respectively;

a second electrode formed on the substrate at a rear surface thereof;

second electrically conductive type deep layers formed on the drift layer in areas spaced from the trench with the base regions being intervened each in a depth equal to or greater than a depth of the trench and having a concentration equal to or greater than that of the base regions; and channel regions formed on surface areas of the base regions to allow an electric current to flow between the first and second electrodes via the source regions and the drift layer and upon controlling a voltage applied to the gate electrode, wherein the deep layers include metallic layers spaced from the trench with the base regions being intervened and each formed in a depth equal to or greater than a depth of the trench whereby each of the metallic layers and the drift layer are operative to act as a Schockley diode.

11. A silicon carbide semiconductor device, which is an accumulation-type trench gate structure MOSFET, comprising:

a first or second electrically conductive type substrate made of 4H silicon carbide and having a surface on one of a (000-1) c-plane and a (0001) Si-plane;

a drift layer formed on the substrate with the first electrically conductive type silicon carbide having a lower impurity concentration than that of the substrate;

a trench formed with a surface of the drift layer and having sidewalls formed with surfaces extending in one of a [11-20] direction and a [1-100] direction;

base regions, formed in the drift layer in areas on both sides of the trench such that the trench is sandwiched, which are made of the second electrically conductive type silicon carbide;

source regions, formed on upper layer portions of the base regions in contact with the sidewalls of the trench such that the trench is sandwiched, which are made of the first electrically conductive type silicon carbide having a higher concentration than that of the drift layer;

a gate oxide film, formed on an upper area of a bottom wall of the trench upon thermally oxidizing a surface of the trench, which has a thickness greater than that of each sidewall of the trench;

a gate electrode formed in the trench in an area above the gate oxide film;

a first electrode electrically connected to the source regions, respectively;

a second electrode formed on the substrate at a rear surface thereof;

second electrically conductive type deep layers formed on the drift layer in areas spaced from the trench with the base regions being intervened each in a depth equal to or greater than a depth of the trench and having a concentration equal to or greater than that of the base regions; and channel regions formed on surface areas of the base regions to allow an electric current to flow between the first and second electrodes via the source regions and the drift layer, wherein the channel regions include first electrically conductive type channel layers, formed on surfaces of the trench in contact with the sidewalls of the trench so as to straddle the drift layer and the source regions and made of silicon carbide, whose channels are controlled upon controlling a voltage applied to the gate electrode, and the deep layers include metallic layers spaced from the trench with the base regions being intervened and formed in a depth equal to or greater than a depth of the trench whereby each of the metallic layers and the drift layer are operative to act as a Schockley diode.

* * * * *